United States Patent

Sato et al.

(10) Patent No.: US 9,520,830 B2
(45) Date of Patent: Dec. 13, 2016

(54) CRYSTAL OSCILLATOR

(71) Applicant: FANUC Corporation, Yamanashi (JP)

(72) Inventors: Junichi Sato, Yamanashi (JP); Katsuhiko Watanabe, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 14/973,819

(22) Filed: Dec. 18, 2015

(65) Prior Publication Data

US 2016/0181976 A1    Jun. 23, 2016

(30) Foreign Application Priority Data

Dec. 19, 2014  (JP) .................................. 2014-257506

(51) Int. Cl.
  *H03B 5/30*    (2006.01)

(52) U.S. Cl.
  CPC ........................................ *H03B 5/30* (2013.01)

(58) Field of Classification Search
  CPC ........................................................ H03B 5/32
  USPC ........................................ 331/158, 160, 182
  See application file for complete search history.

(56) References Cited

U.S. PATENT DOCUMENTS

| | | | |
|---|---|---|---|
| 5,113,156 A * | 5/1992 | Mahabadi | H03B 5/364 331/109 |
| 7,123,113 B1 * | 10/2006 | Brennan | H03L 5/00 331/116 FE |
| 2006/0244546 A1 * | 11/2006 | Yamamoto | H03B 5/04 331/158 |
| 2014/0210565 A1 * | 7/2014 | Vilas Boas | H03L 5/00 331/158 |

FOREIGN PATENT DOCUMENTS

| | | |
|---|---|---|
| JP | 2001-094347 A | 4/2001 |
| JP | 2007-116563 A | 5/2007 |
| JP | 2010-246059 A | 10/2010 |

* cited by examiner

*Primary Examiner* — Joseph Chang
(74) *Attorney, Agent, or Firm* — Hauptman Ham, LLP

(57) ABSTRACT

A crystal oscillator has characteristics in that reduction in oscillation margin makes the crystal oscillator less likely to oscillate, with the result that an amplitude of a voltage waveform at an input terminal of a CMOS inverter is reduced. A crystal oscillator of the invention has a detection circuit that outputs an alarm signal when the amplitude of the voltage waveform at the input terminal of the CMOS inverter becomes equal to or less than a predetermined specified value. As a result, it is possible to detect a change in the oscillation margin of the crystal oscillator without switching between circuits even after the crystal oscillator is incorporated in a device.

13 Claims, 4 Drawing Sheets

VOLTAGE AT POINT A

AMPLITUDE B OF VOLTAGE WAVEFORM AT NORMAL TIME (PEAK TO PEAK OF WAVEFORM)

VOLTAGE AT POINT A

AMPLITUDE C OF VOLTAGE WAVEFORM AT ABNORMAL TIME (PEAK TO PEAK OF WAVEFORM)

AMPLITUDE OF VOLTAGE WAVEFORM AT POINT A

SPECIFIED VALUE

CRYSTAL OSCILLATOR

RELATED APPLICATIONS

The present application claims priority to Japanese Application Number 2014-257506, filed Dec. 19, 2014, the disclosure of which is hereby incorporated by reference herein in its entirety.

BACKGROUND OF THE INVENTION

1. Field of the Invention

The present invention relates to a crystal oscillator.

2. Description of the Related Art

A crystal oscillator is an oscillator having a configuration in which a quartz resonator, a CMOS inverter, a capacitor, a resistor, and a CMOS buffer are encapsulated in a package.

An example of a conventional crystal oscillator will be described with reference to FIG. 4.

A crystal oscillator 10 includes an oscillation circuit part 1, a quartz resonator 2, and a CMOS buffer 6 serving as an output circuit part, and the oscillation circuit part 1 includes a resistor 4, a CMOS inverter 5, and capacitors 8a and 8b. Thus, the crystal oscillator 10 has a circuit configuration that a general crystal oscillator has. An output terminal 7 is connected to an output part of the CMOS buffer 6. Quartz resonator measurement terminals 3a and 3b are connected to both ends of the quartz resonator 2, respectively.

A power supply (not shown) is connected to the oscillation circuit part 1 and CMOS buffer 6, and supplies a predetermined voltage to the oscillation circuit part 1 and CMOS buffer 6 for their operation.

Generally, a crystal oscillator does not oscillate when a resistance value of the quartz resonator 2 is larger than a negative resistance value of the oscillation circuit part 1. Thus, in order to stably continue oscillation of the crystal oscillator, it is important to reduce the resistance value of the quartz resonator 2 and to increase the negative resistance value of the oscillation circuit part 1. As a value indicating whether or not the crystal oscillator stably oscillate, a ratio between the negative resistance value of the oscillation circuit part 1 and the resistance value of the quartz resonator 2 has conventionally been used as "oscillation margin". Experiments reveals that stable oscillation can be obtained when a value of the oscillation margin is 4 to 5 or more.

There is a method that checks the oscillation margin of the crystal oscillator. In this method, the resistance value of the quartz resonator 2 is measured at the quartz resonator measurement terminals 3a and 3b which are exposed outside the package, and it is checked whether or not the measured value is sufficiently small.

Further, as a method for checking the oscillation margin of a crystal oscillator which has been incorporated in a device, JP 2007-116563 A discloses a technology in which a check resistor is connected in series between a quartz resonator and an oscillation circuit, and it is checked whether the crystal oscillator normally oscillates or not by switching connection to the check resistor in response to a control signal from outside.

JP 2001-94347 A discloses a technology in which a variable resistor is connected in series between a crystal current control circuit and a quartz resonator, and a resistance value at which oscillation is stopped is measured by varying the crystal current and the variable resistor.

JP 2010-246059 A discloses a technology that calculates a series resonance resistance value of the quartz resonator from the negative resistance value obtained when oscillation is stopped or started by changing the negative resistance value of the oscillation circuit part of the crystal oscillator using a control signal from outside.

In the method that measures the resistance value of the quartz resonator 2 at the quartz resonator measurement terminals 3a and 3b exposed outside the package, measurement is made at a specified drive level, so that it is difficult to check the resistance value during normal operation of the crystal oscillator. Further, the resistance value of the quartz resonator 2 may change in characteristics depending on a condition of foreign matters adhered thereto or due to influence of heat treatment, so that it is difficult to grasp a change in state after inspection time, even if no abnormality has been founded at the inspection time. Furthermore, although this method can be easily applied to a single crystal oscillator, the measurement may be difficult to perform after the crystal oscillator is incorporated in a system.

In the technologies disclosed in JP 2007-116563 A, JP 2001-94347 A, and JP 2010-246059 A, the measurement needs to be performed in a state where operation of the crystal oscillator to be measured is stopped. Thus, execution of the measurement may lead to stop of a part of or the entire system. Particularly, the measurement is difficult to perform when a crystal oscillator to be measured is used as a clock of a controller that measures the oscillation margin.

SUMMARY OF THE INVENTION

An object of the present invention is to provide a crystal oscillator capable of detecting degradation in the oscillation margin without stopping normal operation thereof.

A crystal oscillator according to the present invention includes: a quartz resonator; an oscillation circuit part including a CMOS inverter, a capacitor, and a resistor and configured to oscillate the quartz resonator; and a CMOS buffer serving as an output circuit part. Further, the crystal oscillator includes a detection circuit outputting an alarm signal when an amplitude of a voltage waveform at an input terminal of the CMOS inverter becomes equal to or less than at least one predetermined specified value.

According to the above crystal oscillator, the alarm signal is output when the amplitude of the voltage waveform at the input terminal of the CMOS inverter becomes equal to or less than the predetermined specified value. Thus, it is possible to detect a change in oscillation margin of the crystal oscillator without switching between circuits even in a built-in condition of the crystal oscillator. Further, the detection is performed while the crystal oscillator is being operated, so that it is not necessary to stop the system for the detection. Further, the detection is performed while the crystal oscillator is being operated, so that degradation of the crystal oscillator can be detected before oscillation stop of the crystal oscillator, thereby achieving preventive maintenance.

A plurality of different values may be set as the specified value, and the alarm signals to be output when the amplitude of the voltage waveform becomes equal to or less than the set respective specified values may be made different for every specified value.

According to the embodiments, the plurality of values are set as the specified value, and the alarm signals to be output when the amplitude of the voltage waveform becomes equal to or less than the set respective specified values are made different for every specified value, thereby allowing a degree of the degradation of the crystal oscillator to be detected stepwise.

The detection circuit may be an amplitude detection circuit such a full-wave rectifier, a peak hold circuit, or a sample hold circuit.

According to the present invention, a crystal oscillator capable of detecting degradation in the oscillation margin without stopping normal operation thereof can be provided.

BRIEF DESCRIPTION OF THE DRAWINGS

The above object and other objects and features of the present invention will be apparent from the description of the following embodiments with reference to the accompanying drawings. Among these drawings.

DETAILED DESCRIPTION OF THE PREFERRED EMBODIMENTS

A first embodiment of a crystal oscillator according to the present invention will be described using FIG. 1.

A crystal oscillator (FIG. 1) of the present embodiment differs from the conventional crystal oscillator in that it has, at an input part (point A) of the CMOS inverter 5, a detection circuit 30 for detecting an amplitude of a voltage waveform (peak to peak of a waveform) at the input part. As the detection circuit 30, a conventional amplitude detection circuit such as a full-wave rectifier, a peak hold circuit, or a sample hold circuit can be used.

Figure 1:
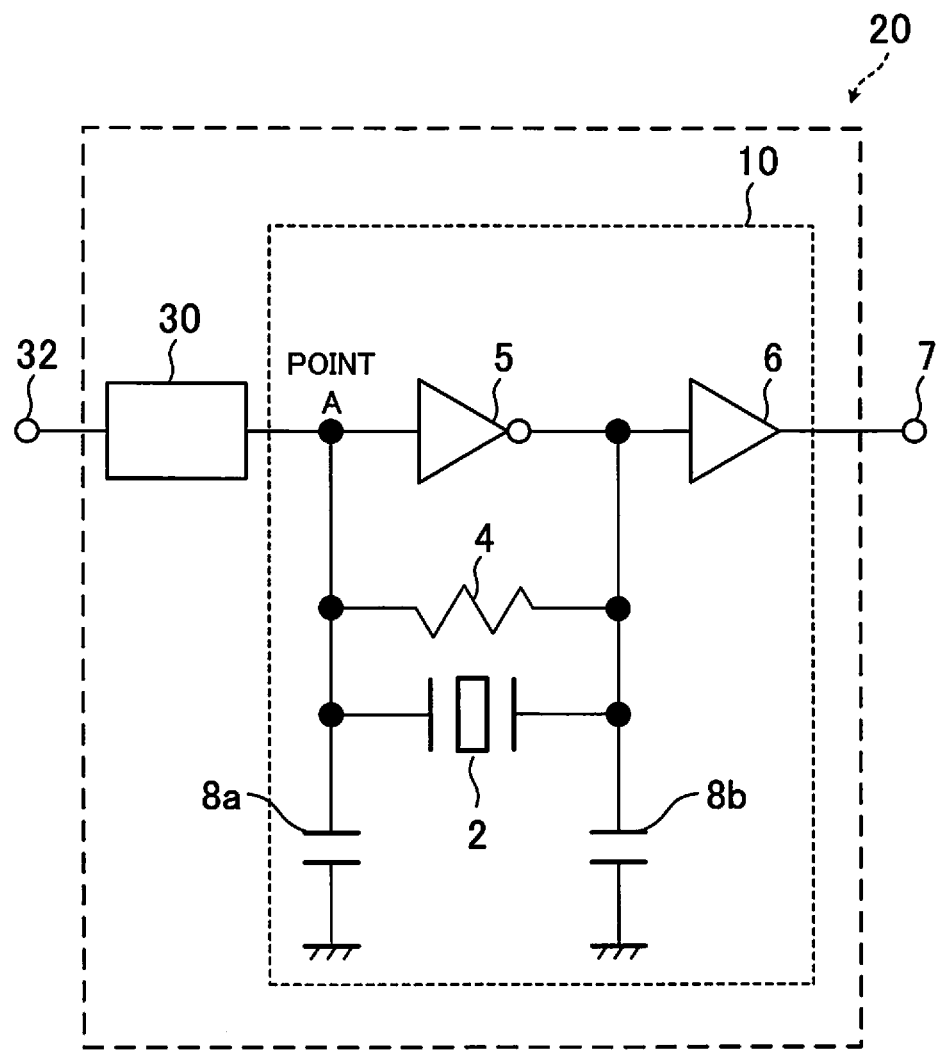
FIG. 1 is a block diagram of a first embodiment of a crystal oscillator according to the present invention.
Figure 4:
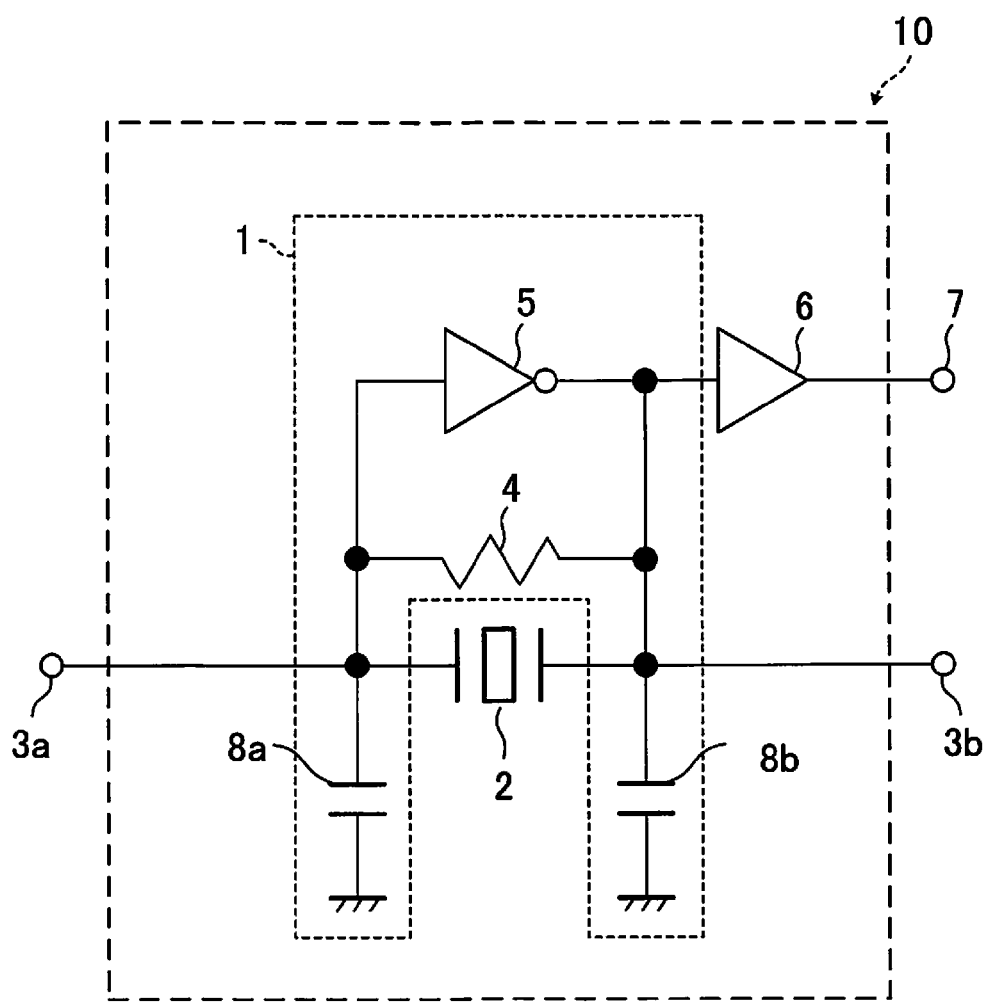
FIG. 4 is a block diagram of a conventional crystal oscillator.

In the crystal oscillator of FIG. 1, the same reference numerals are given to the same parts as those of the conventional crystal oscillator illustrated in FIG. 4, and the repeated description will be omitted.

Figure 2A:
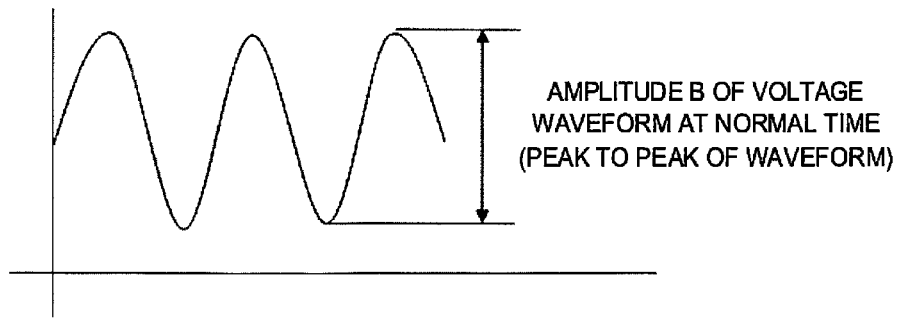
FIGS. 2A to 2C are views each illustrating a voltage waveform at an input terminal of a CMOS inverter of the crystal oscillator of FIG. 1.
Figure 2B:
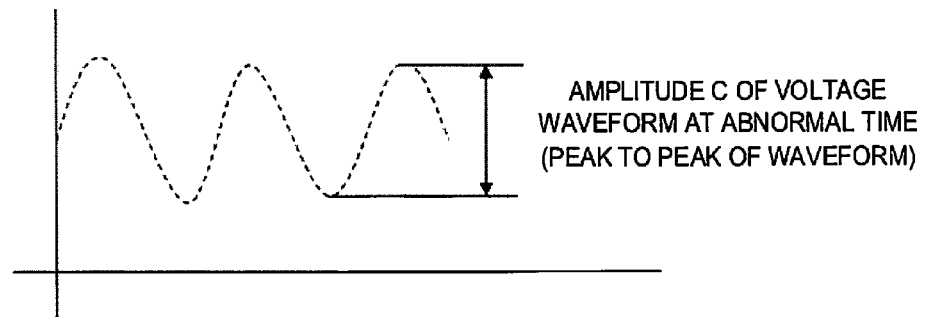
Figure 2C:
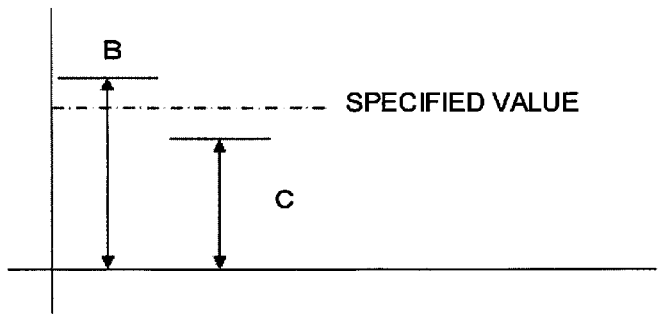
Figure 3A:
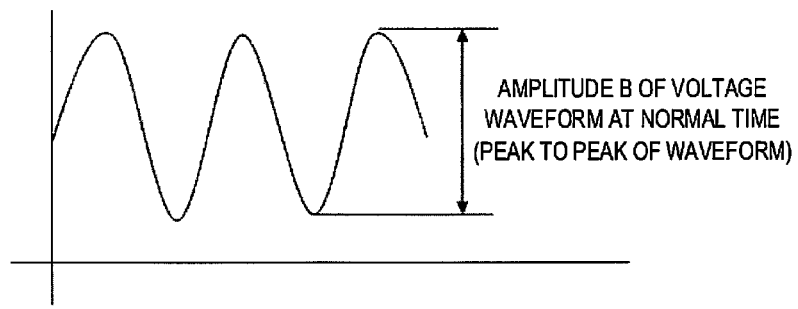
FIGS. 3A to 3D are views each illustrating an amplitude of a voltage waveform in a second embodiment of the crystal oscillator according to the present invention.
Figure 3B:
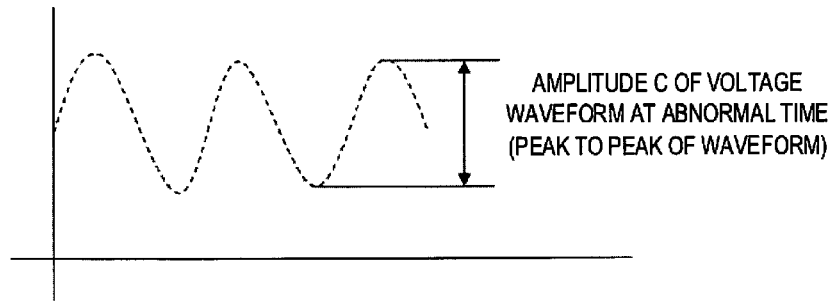
Figure 3C:
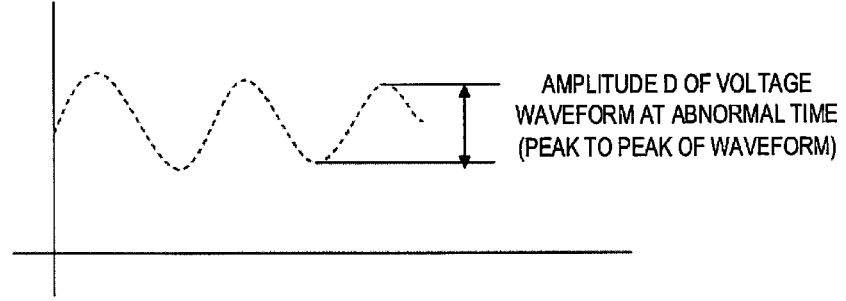
Figure 3D:
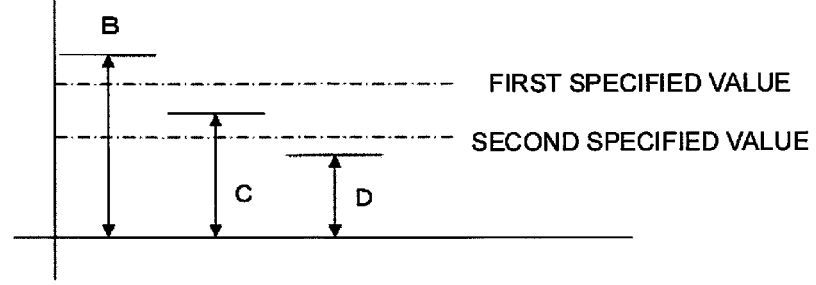

FIGS. 2A to 2C each illustrate a voltage waveform at the input terminal (point A) of the CMOS inverter 5 of the crystal oscillator of FIG. 1.

The crystal oscillator has characteristics in that reduction in the oscillation margin makes the crystal oscillator less likely to oscillate, with the result that the amplitude of the voltage waveform at the input terminal (point A) of the CMOS inverter 5 is reduced. Thus, at an abnormal time when the oscillation margin is reduced, an amplitude (C) of the voltage waveform denoted by a dotted line in FIG. 2B becomes smaller than an amplitude (B) of the voltage waveform at a normal time denoted by a continuous line in FIG. 2A.

Thus, as illustrated in FIG. 2C, a specified value is previously set as a value reduced from a high-level value at the normal time by a predetermined amount or a predetermined rate, and the detection circuit 30 is used to constantly detect the amplitude of the voltage waveform at the input terminal (point A) of the CMOS inverter 5 of the crystal oscillator. When the reduction in the amplitude becomes equal to or less than the set specified value, an alarm signal is output to an alarm signal output terminal 32. The alarm signal to be output may have various forms such as light of lamp light or buzzer sound indicating warning, or an error display on a display unit. As a result, it is possible for the system to detect reduction in the negative resistance due to degradation in the oscillation circuit part 1 of the crystal oscillator and reduction in the amplitude of the voltage waveform at the input terminal (point A) of the CMOS inverter 5 due to degradation in the crystal oscillator which is caused by increase in the resistance value due to degradation in the quartz resonator 2.

A second embodiment of the crystal oscillator according to the present invention will be described using FIGS. 3A to 3D.

In the present embodiment, two (first and second) specified values are set for abnormal determination, considering that the amplitude of the voltage waveform at the input terminal (point A) of the CMOS inverter 5 is reduced with the reduction in the oscillation margin of the crystal oscillator, and the alarm signal is made different between when the amplitude of the voltage waveform at the input terminal (point A) of the CMOS inverter 5 becomes equal to or less than the first specified value and when it becomes equal to or less than the second specified value lower than the first specified value.

As in the above-described first embodiment, the alarm signal to be output can have various forms such as light, sound, or display, and by changing color or brightness of the light, pitch or volume of the sound, or a display mode according to different alarm signals, it is possible to grasp that the amplitude of the voltage waveform has become equal to or less than each of the different specified values. In the present embodiment, two specified values are set, and different alarm signals are output at the respective times when the amplitude of the voltage waveform has become equal to or less than the set specified values. The number of the specified values to be set is not limited to two, but more specified values may be used for issuing different alarm signals for the respective specified values.

In the above embodiments, it is possible to constantly monitor the degradation of the oscillation margin of the crystal oscillator without switching between circuits even after the crystal oscillator is incorporated in a device. Further, as it is possible to detect the degradation of oscillation margin of the crystal oscillator without interrupting the normal operation of the crystal oscillator, a system that uses the crystal oscillator as a clock need not be stopped. Thus, the measurement can be performed even when the crystal oscillator serves as a clock for a controller that measures the oscillation margin. Further, as the degradation of oscillation margin of a crystal oscillator is constantly monitored during the normal operation of the crystal oscillator, it is possible to find a degradation before output of the crystal oscillator is stopped, thereby achieving preventive maintenance.

The invention claimed is:

1. A crystal oscillator, comprising:
   a quartz resonator;
   an oscillation circuit including a CMOS inverter, a capacitor, and a resistor, the oscillation circuit configured to oscillate the quartz resonator;
   a CMOS buffer configured as an output circuit, and having an input coupled to an output of the CMOS inverter; and
   a detection circuit having an input coupled to an input of the CMOS inverter, the detection circuit configured to output an alarm signal when an amplitude of a voltage waveform at the input of the CMOS inverter becomes equal to or less than at least one predetermined specified value.

2. The crystal oscillator according to claim 1, wherein a plurality of different values are set as the specified value, and the alarm signals to be output when the amplitude of the voltage waveform becomes equal to or less than the set respective specified values are made different for every specified value.

3. The crystal oscillator according to claim 1, wherein the detection circuit is a full-wave rectifier.

4. The crystal oscillator according to claim 1, wherein the detection circuit is a peak hold circuit.

5. The crystal oscillator according to claim 1, wherein the detection circuit is a sample hold circuit.

6. The crystal oscillator according to claim 1, wherein the alarm signal includes light.

7. The crystal oscillator according to claim 1, wherein the alarm signal includes sound.

8. The crystal oscillator according to claim 1, wherein the alarm signal includes an error display on a display unit.

9. The crystal oscillator according to claim 2, wherein different alarm signals include light of different colors.

10. The crystal oscillator according to claim 2, wherein different alarm signals include light of different brightness.

11. The crystal oscillator according to claim 2, wherein different alarm signals include sound of different pitches.

12. The crystal oscillator according to claim 2, wherein different alarm signals include sound of different volumes.

13. The crystal oscillator according to claim 2, wherein different alarm signals include different display modes on a display unit.

* * * * *